United States Patent [19]
Hotta et al.

[11] 4,337,523
[45] Jun. 29, 1982

[54] BIPOLAR MEMORY CIRCUIT

[75] Inventors: Atsuo Hotta, Higashiyamato; Yukio Kato, Kodaira; Teruo Isobe, Hinode, all of Japan

[73] Assignee: Hitachi, Ltd., Tokyo, Japan

[21] Appl. No.: 157,953

[22] Filed: Jun. 9, 1980

[30] Foreign Application Priority Data

Aug. 29, 1979 [JP] Japan .................. 54-109151

[51] Int. Cl.³ .......................................... G11C 7/00
[52] U.S. Cl. ................................. 365/194; 365/233
[58] Field of Search ................. 365/190, 194, 233; 307/208

[56] References Cited
U.S. PATENT DOCUMENTS

| 3,325,790 | 6/1967 | Gloates et al. | 365/194 |
| 3,866,061 | 2/1975 | Wen et al. | 365/194 |
| 4,165,540 | 8/1979 | Vinot | 365/194 |

FOREIGN PATENT DOCUMENTS 55-38603  3/1980  Japan ......................... 365/194

OTHER PUBLICATIONS

Riley, Special Report: Semiconductor Memories are taking over Data–Storage Applications, Electronics, 8/2/73, vol. 46, #76, pp. 75–87.
Munchrath, Integrierte Halbleiterspeicher, Elektronik, 1973, Heft 5, Bd. 22, pp. 169–174.

Primary Examiner—Stuart N. Hecker
Attorney, Agent, or Firm—Craig and Antonelli

[57] ABSTRACT

A bipolar memory circuit is provided with a delay circuit which receives a write enabling signal, a gate circuit which detects the coincidence between an input signal and an output signal of the delay circuit, and a circuit which is started by an output signal of the gate circuit and which provides a pulse signal of a fixed time. The operation of a write driver circuit in the bipolar memory circuit is controlled by the pulse signal. Noise interfering in the write enabling signal are neglected by the use of the delay circuit and the gate circuit. The pulse width of the write enabling signal is permitted to be made smaller than the pulse width of the pulse signal required by the write driver circuit.

8 Claims, 15 Drawing Figures

4,337,523

BIPOLAR MEMORY CIRCUIT

BACKGROUND OF THE INVENTION

This invention relates to a bipolar memory circuit which has current switching type memory cells.

In the bipolar memory circuit having the current switching type memory cells, the distinction between the read cycle and write cycle of information is determined in accordance with the level of a write enabling signal which is externally supplied.

The bipolar memory circuit can therefore cause a malfunction in response to the interference of a noise in the write enabling signal in, for example, a read cycle period.

In order to prevent the bipolar memory circuit from erroneously operating in response to the noise etc., a method wherein a write enabling signal and a signal obtained by delaying the write enabling signal are logically combined and the resulting composite signal is used as an input signal to a write driver circuit has been proposed as disclosed in Japanese patent application Laid-open Publication which was published on Mar. 18, 1977, No. 52-35535. According to this method, any pulse noise to interfere in the write enabling signal as has a pulse width less than the signal delay time becomes negligible.

With the known method, however, the setup time becomes longer by the delay time of the signal. Moreover, since the write time in the signal obtained by the logic combination decreases, the pulse width of the write enabling signal to be externally supplied must be increased. With the known method, accordingly, the write cycle period lengthens.

SUMMARY OF THE INVENTION

An object of this invention is to provide a bipolar memory circuit which can perform a high-speed and stable write operation.

Another object of this invention is to provide a bipolar memory circuit which can make the application timing margin of a write enabling signal large.

Another object of this invention is to provide a bipolar memory circuit in which the fluctuations of a reference potential attributed to the changes of the operating current of an information readout circuit are small.

Futher objects of this invention will become apparent from the following description taken in conjunction with the drawings.

DESCRIPTION OF THE PREFERRED EMBODIMENTS

In accordance with this invention, there is disposed a pulse generator which is started by a write enabling signal having a pulse width greater than a predetermined time as is externally supplied and which forms a signal of a pulse width being constant irrespective of the first-mentioned pulse width, and the output signal of the pulse generator is substantially made a write enabling signal for a memory cell.

Hereunder, this invention will be described in detail in connection with embodiments.

Figure 1:
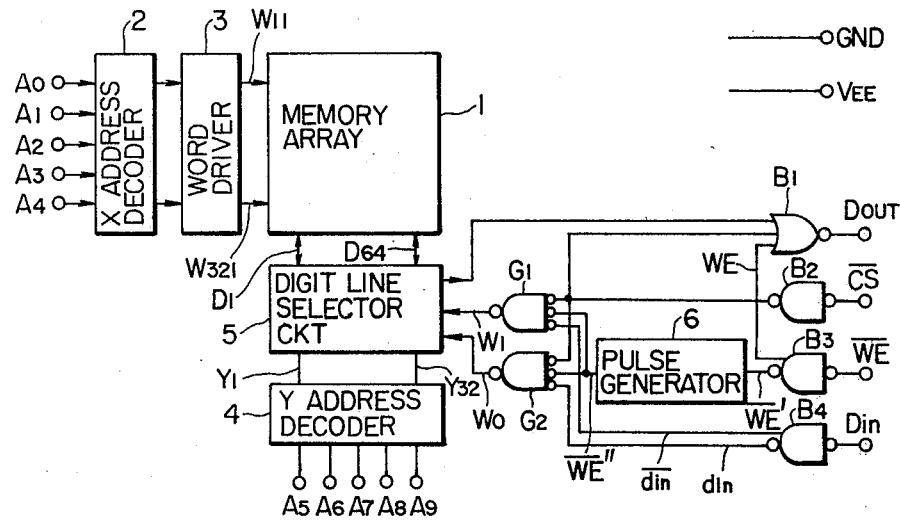
FIG. 1 is a block diagram showing an embodiment of this invention.

FIG. 1 is a block diagram of a bipolar memory circuit showing an embodiment of this invention.

Respective circuit blocks in the figure are formed on a single semiconductor substrate by known semiconductor integrated circuit techniques. Terminals $A_0$ to $A_9$, $D_{OUT}$, $\overline{CS}$, $\overline{WE}$, $D_{in}$, GND and $V_{EE}$ are formed as external terminals a semiconductor integrated circuit device (IC).

Numeral 1 designates a memory array. It includes a plurality of current switching (emitter-coupled) type memory cells, a plurality of word lines $W_{11}$ to $W_{321}$ and a plurality of digit lines as will become apparent from FIG. 3 later.

Numeral 2 designates an X address decoder. By receiving an address signal of a plurality of bits $A_0$ to $A_4$, it forms an X address select signal for selecting one of the plurality of word lines of the memory array 1.

Shown at 3 is a word driver. By receiving the output of the X address decoder 2, it forms a word line select signal for performing the selection of the word line.

Shown at 4 is a Y address decoder. By receiving an address signal of a plurality of bits $A_5$ to $A_9$, it forms Y address select signals $Y_1$ to $Y_{32}$ for selecting the plurality of digit lines of the memory array.

Numeral 5 indicates a digit line selector circuit, which forms signals for selecting the plurality of digit lines of the memory array by the use of the Y address select signals.

Figure 3:
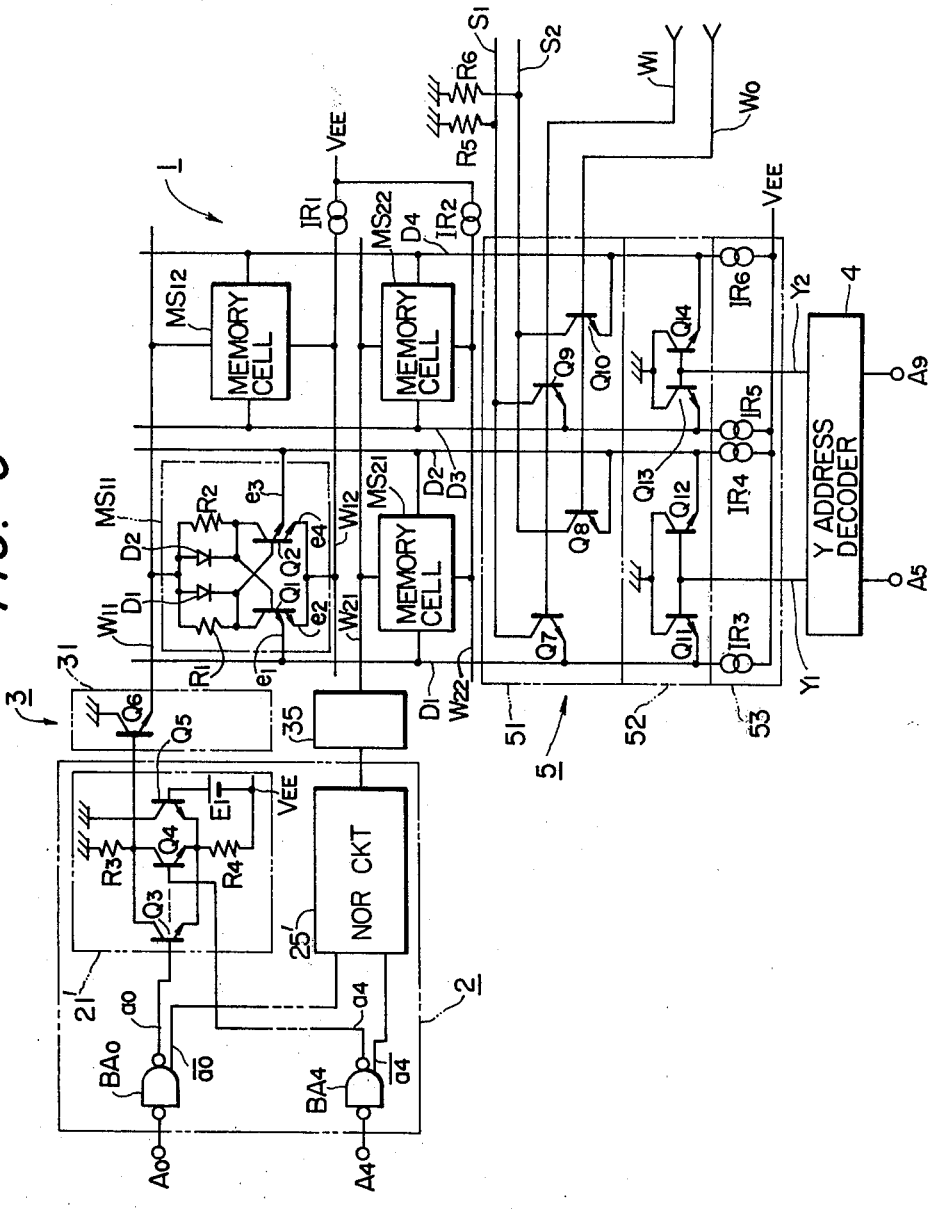
FIG. 3 is a concrete circuit diagram of a memory array.

FIG. 3 shows concrete examples of the memory array 1, the X address decoder 2, the word driver 3 and the digit line selector circuit 5 in FIG. 1.

The memory array 1 is constructed of memory cells $MS_{11}$ to $MS_{22}$ in a matrix arrangement, word lines $W_{11}$ and $W_{21}$, lower word lines $W_{12}$ and $W_{22}$, holding current sources $IR_1$ and $IR_2$, and digit lines $D_1$ to $D_4$.

As the memory cell $MS_{11}$ is typically illustrated, each of the memory cells $MS_{11}$ to $MS_{22}$ is constructed of a pair of multiemitter transistors $Q_1$ to $Q_2$ whose bases and collectors are cross-connected, and resistors $R_1$ and $R_2$ and diodes $D_1$ and $D_2$ which are used as the collector loads of the transistors $Q_1$ and $Q_2$.

As shown in the figure, pluralities of memory cells arranged in the same rows are respectively connected in common to the word lines $W_{11}$ and $W_{21}$ and the lower word lines $W_{12}$ and $W_{22}$. The holding current sources $IR_1$ and $IR_2$ are connected between the lower word lines $W_{12}$ and $W_{22}$ and a negative voltage source terminal $V_{EE}$.

Input and output terminals $e_1$ and $e_3$ of pluralities of memory cells arranged in the same columns are respectively connected in common to the digit lines $D_1$ to $D_4$ as shown in the figure.

The X address decoder 2 is constructed of address buffers $BA_0$ to $BA_4$ and NOR circuits $21'$ to $25'$.

The address buffers $BA_0$ to $BA_4$ provide non-inverted signals at terminals $\bar{a}_0$ to $\bar{a}_4$ and inverted signals at terminals $a_0$ to $a_4$ in response to the input address signals which are supplied through the respectively corresponding external terminals $A_0$ to $A_4$.

Each of the NOR circuits $21'$ and $25'$ is constructed of transistors $Q_3$ to $Q_4$ whose bases selectively receive the output signals of the address buffers $BA_0$ to $BA_4$, a transistor $Q_5$ whose base receives an output voltage from a reference voltage source $E_1$, and resistors $R_3$ and $R_4$.

The word driver 3 is constructed of emitter follower circuits 31 to 35 each of which includes an emitter follower transistor $Q_6$.

The digit line selector circuit 5 is constructed of a writing and reading circuit 51, a selector circuit 52 and a constant current circuit 53.

The writing and reading circuit 51 includes transistors $Q_7$ to $Q_{10}$ which are disposed in correspondence with the digit lines $D_1$ to $D_4$. The transistors $Q_7$ and $Q_9$ whose emitters are connected to one-side digit lines $D_1$ and $D_3$ in the respective pairs of digit lines $D_1$ and $D_2$, and $D_3$ and $D_4$ have their collectors connected in common to a sense line $S_1$ and have their bases connected in common to a write line $W_1$. Similarly, the transistors $Q_8$ and $Q_{10}$ whose emitters are connected to the other-side digit lines $D_2$ and $D_4$ have their collectors connected in common to a sense line $S_2$ pairing with the sense line $S_1$ and have their bases connected in common to a write line $W_0$ pairing with the write line $W_1$.

The selector circuit 52 includes transistors $Q_{11}$ to $Q_{14}$ which are disposed in correspondence with the digit lines $D_1$ to $D_4$. The bases of the transistors $Q_{11}$ and $Q_{12}$ corresponding to the pair of digit lines $D_1$ and $D_2$ are supplied with the Y address select signal $Y_1$ of the Y address decoder 4, while the bases of the transistors $Q_{13}$ and $Q_{14}$ corresponding to the other pair of digit lines $D_3$ and $D_4$ are similarly supplied with the Y address select signal $Y_2$.

The constant current circuit 53 is constructed of constant current means $IR_3$ to $IR_6$ which are connected between the respective digit lines $D_1$ to $D_4$ and the negative voltage source terminal $V_{EE}$.

The selection and non-selection of the memory cells in the memory array 1 and the reading of information from the selected memory cell as well as the writing of information into the selected memory cell are determined in accordance with the current switching operations among those transistors in the memory cells, the reading and writing circuit 51 and the selector circuit 52 whose emitters are connected in common to the digit lines.

The word line not to be selected is made a comparatively low potential (hereinbelow, termed "$V_L$"). In contrast, the word line to be selected is made a comparatively high potential (hereinbelow, termed "$V_H$") so that the lower one of the collector potentials of the two transistors $Q_1$ and $Q_2$ in the memory cell connected to this word line may become higher than the higher one of the collector potentials of the two transistors $Q_1$ and $Q_2$ in the memory cells connected to the non-selected word line.

The Y address select line not to be selected is made a high potential (hereinbelow, termed "$V_{YH}$") which is somewhat higher than the $V_H$, whereas the Y address select line to be selected is made a low potential (hereinbelow, termed "$V_{YL}$") which is lower than the lower collector potential of the two transistors $Q_1$ and $Q_2$ in the memory cell connected to the selected word line.

At reading, both the write lines $W_1$ and $W_0$ are made a reference potential (hereinbelow, termed "$V_R$") which is intermediate between the collector potentials of the transistors $Q_1$ and $Q_2$ of the memory cell connected to the selected word line. At writing, that one of the write lines $W_1$ and $W_0$ which has been selected in accordance with an information to be written is made a potential (hereinbelow, termed "$L_{WL}$") which is lower than the lower one of the two collector potentials, while the other is made substantially the reference potential $V_R$.

In case where the Y address select line $Y_1$ is made the non-selection level $V_{YH}$, the transistors $Q_{11}$ and $Q_{12}$ of the selector circuit 52 are brought into the "on" state by the high potential $V_{YH}$ of the Y address select line $Y_1$, and the constant current means $IR_3$ and $IR_4$ are supplied with currents from the transistors $Q_{11}$ and $Q_{12}$. In consequence, the emitters $e_1$ and $e_3$ connected to the digit lines $D_1$ and $D_2$ in the memory cells $MS_{11}$ and $MS_{21}$ are held in the "off" state. In this case, currents for holding information flow to the memory cells $MS_{11}$ and $MS_{21}$ owing to the holding current means $IR_1$ and $IR_2$. At this time, the transistors $Q_7$ and $Q_8$ of the reading and writing circuit 51 are also held in the "off" state in correspondence with the "on" state of the transistors $Q_{11}$ and $Q_{12}$.

When the word line $W_{11}$ is made the selection level $V_H$ and the Y address select line $Y_1$ is made the selection level $V_{YL}$, the memory cell $MS_{11}$ is selected. In this case, both the transistors $Q_{11}$ and $Q_{12}$ of the selector circuit 52 are brought into the "off" state by the current switching operation as described above.

Although this is not especially restrictive, "1" of stored information in the memory cell is caused to correspond to the "on" state of the transistor $Q_1$ and the "off" state of the transistor $Q_2$, and "0" is caused to correspond to the "off" state of the transistor $Q_1$ and the "on" state of the transistor $Q_2$.

At the reading, if the information of the selected memory cell $MS_{11}$ is "1", the base potential of the transistor $Q_1$ of this memory cell $MS_{11}$ is made a potential higher than the base potential $V_R$ of the transistor $Q_7$. In consequence, current flows from the emitter $e_1$ of the transistor $Q_1$ to the constant current means $IR_3$. In contrast, the base potential of the transistor $Q_1$ is made a potential lower than the base potential $V_R$ of the transistor $Q_8$. In consequence, current flows from the transistor $Q_8$ to the constant current source $IR_4$. The current through the transistor $Q_8$ gives rise to a voltage drop across a load resistor $R_6$ connected to the sense line $S_2$. That is, in accordance with "1" being the stored information in the selected memory cell $MS_{11}$, the sense line $S_1$ is made the high level and the sense line $S_2$ is made the low level. In contrast, if the stored information in the selected memory cell $MS_{11}$ is "0", the sense line $S_1$ is made the low level and the sense line $S_2$ is made the high level.

At the writing, in response to e.g. the high level of a data signal supplied to the external terminal $D_{in}$, the write line $W_1$ is made the low potential $V_{WL}$ and the write line $W_0$ is made the reference potential $V_R$. In this case, if the memory cell to be selected is $MS_{11}$, current is caused to flow from the emitter $e_1$ of the transistor $Q_1$ of the memory cell $MS_{11}$ to the constant current means $IR_3$ by the current switching operation of this transistor $Q_1$ and the transistor $Q_7$ irrespective of the previous "on" or "off" state of the transistor $Q_1$. As a result, the transistor $Q_1$ is brought into the "on" state, and "1" as an information is written into the memory cell $MS_{11}$.

Referring back to FIG. 1, symbols $B_2$ to $B_4$ designate input buffer circuits which receive the chip select signal $\overline{CS}$, the write enabling signal $\overline{WE}$ and the data input signal $D_{in}$ externally applied to the IC, respectively.

An output signal of the buffer circuit $B_2$ is made inphase with the chip select signal being the input, and is supplied to an output buffer circuit $B_1$ and gate circuits $G_1$ and $G_2$. In this embodiment, although no special restriction is intended, the chip or memory circuit is put into the selected state by the low level of the chip select signal $\overline{CS}$ and into the non-selected state by the high level thereof as will become apparent later.

The buffer circuit $B_3$ provides a signal $\overline{WE}'$ inphase with the write enabling signal $\overline{WE}$ of the input as is supplied to a pulse generator 6 to be described later, and an inphase signal WE which is supplied to the buffer circuit $B_1$. The write enabling signal $\overline{WE}$ is made a low level when an information is to be written into the memory cell, and is made a high level when an information is to be read out of the memory cell.

The buffer circuit $B_4$ provides a signal $\overline{d_{in}}$ antiphase to the input data signal $D_{in}$ as is supplied to the gate circuit $G_1$, and an inphase signal $d_{in}$ which is supplied to the gate circuit $G_2$.

Figure 2:
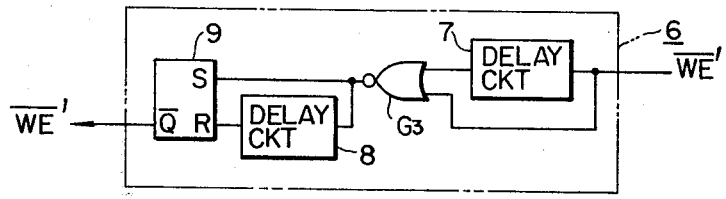
FIG. 2 is a logic circuit diagram of a pulse generator according to this invention.

As shown in FIG. 2, the pulse generator 6 is constructed of a first delay circuit 7 which delays the write enabling signal $\overline{WE}'$ supplied from the buffer circuit $B_3$, a NOR gate circuit $G_3$ which receives a delayed signal provided from the delay circuit 7 and the write enabling signal $\overline{WE}'$, a second delay circuit 8 which delays an output signal of the gate circuit $G_3$, and a reset-preferential flip-flop circuit 9 whose set input is the output of the gate circuit $G_3$ and whose reset input is an output signal of the second delay circuit 8. As will be elucidated later, the inverted output $\overline{Q}$ of the flip-flop circuit 9 is used as a write enabling signal $\overline{WE}''$ which is applied to the gate circuits $G_1$ and $G_2$.

The gate circuit $G_1$ provides the write line $W_1$ with a write signal by receiving the chip select signal $\overline{CS}$ through the input buffer circuit $B_2$, the write enabling signal $\overline{WE}$ through the pulse generator 6 and the inverted signal of the input data signal $D_{in}$ through the buffer circuit $B_4$ as described above. The write signal on the write line $W_1$ is made the low potential $V_{WL}$ only when the write enabling signal $\overline{WE}''$ supplied from the pulse generator 6 is at the low level and besides the input data signal $D_{in}$ is at the high level in correspondence with "1" of the information, and it is made the reference potential $V_R$ at any other time, that is, when the write enabling signal $\overline{WE}''$ is at the high level or when the input data signal $D_{in}$ is at the low level in correspondence with "0" of the information.

The gate circuit $G_2$ has the same construction as that of the gate circuit $G_1$ except that it receives the signal inphase with the input data signal $D_{in}$ through the buffer circuit $B_4$. Accordingly, it supplies a signal of the level of the low potential $V_{WL}$ to the write line $W_0$ only when the write enabling signal $\overline{We}''$ is at the low level and besides the input data signal $D_{in}$ is at the low level in correspondence with "0" of the information, and it supplies a signal of the level of the intermediate potential $V_R$ at any other time.

Figure 5:
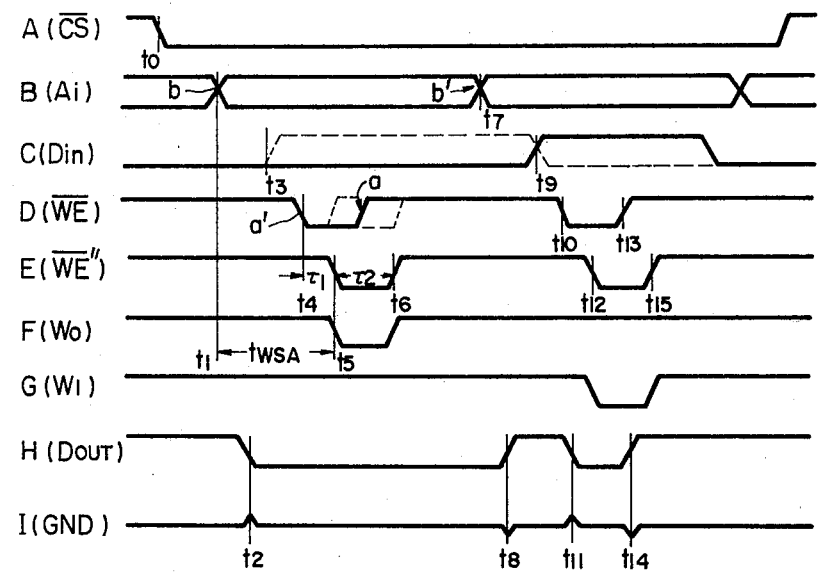

FIG. 5 shows a time chart of the bipolar memory circuit of the above construction.

The chip is put into the selected state in response to the fact that the chip select signal $\overline{CS}$ is made the low level at a time $t_0$ as shown at A in FIG. 5.

As shown at B in FIG. 5, the address signal $A_i$ is set into a state corresponding to the memory cell to-be-selected at a time $t_1$. As shown at H in FIG. 5, the signal $D_{OUT}$ corresponding to the information of the selected memory cell is provided at a time $t_2$ which is later than the time $t_1$ by a delay time determined by the various circuits described above.

In case of writing data, by way of example, the input data $D_{in}$ as shown by a broken line at C in FIG. 5 is set at a time $t_3$, whereupon the write enabling signal $\overline{WE}$ to be applied to the external terminal is brought from the previous high level to the low level as shown at D in FIG. 5 at a time $t_4$.

The NOR gate circuit $G_3$ in the pulse generator 6 receives the low level signals at its two input terminals when the period of time during which the write enabling signal $\overline{WE}$ is held at the low level has reached the delay time $\tau_1$ of the delay circuit 7. That is, the NOR gate circuit $G_3$ provides a signal changing from the low level to the high level at a time $t_5$ at which the period of time $\tau_1$ has lapsed from the time $t_4$. The R-S flip-flop circuit 9 is set by the output signal of the NOR gate circuit $G_3$ at the time $t_5$, and puts the write enabling signal $\overline{WE}''$ at its inverting output terminal $\overline{Q}$ into the low level as shown at E in FIG. 5.

The output signal of the delay circuit 8 is made the high level at a time $t_6$ at which its delay time $\tau_2$ has lapsed from the time $t_5$. As a result, the R-S flip-flop circuit 9 is reset, and the write enabling signal $\overline{WE}''$ at its inverting output terminal $\overline{Q}$ is made the high level again as shown at E in FIG. 5.

Accordingly, the gate circuits $G_1$ and $G_2$ carry out the writing operation for the period of time $\tau_2$ from the time after the time delay $\tau_1$ with respect to the write enabling signal $\overline{WE}$ externally supplied.

At a time $t_7$ after the writing operation has ended, the address signal $A_i$ is altered so as to select a new memory cell, whereupon the operation of reading or writing an information is executed likewise to the above.

Figure 6:
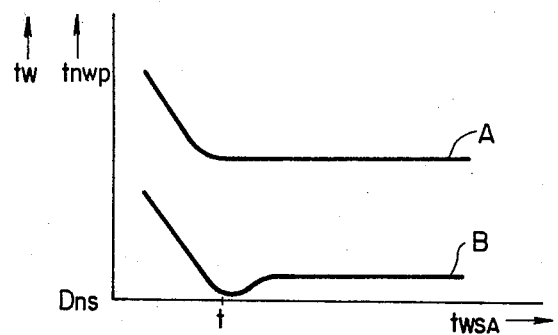
FIG. 6 is a diagram of the write characteristic curves of the bipolar memory circuit.

In the bipolar circuit having the current switching type memory cells as described above, the minimum time $t_w$ required for writing an information into any desired memory cell, in other words, the minimum pulse width required in the write enabling signal $\overline{WE}''$ changes depending upon the setup time $t_{WSA}$ of the write enabling signal $\overline{WE}''$ for the address signal $A_i$ as illustrated by a characteristic curve A in FIG. 6. Accordingly, the duration of the low level in the write enabling signal $\overline{WE}''$ needs to be set greater than the writing time $t_w$.

According to this embodiment, the low level duration of the write enabling signal $\overline{WE}''$ to be supplied to the gate circuits $G_1$ and $G_2$ is determined by the delay circuit 8 within the pulse generator 6 and is not affected by the period of the external write enabling signal $\overline{WE}$.

The low level duration of the write enabling signal $\overline{WE}$ to be externally supplied can be shortened down to a period required for the starting of the pulse generator 6, i.e., a period somewhat exceeding the delay time $\tau_1$ without being limited by the writing time $t_w$. On the other hand, the write enabling signal $\overline{WE}''$ is internally formed as described above, so that the write enabling signal $\overline{WE}$ to be externally supplied can have its back edge a delayed till the back edge b' of the address signal $A_i$. Accordingly, the write enabling signal $\overline{WE}$ to be externally supplied can have its timing margin made large.

The maximum pulse width of the write enabling signal as is determined under the condition that the writing of an information does not occur in any memory cell in the memory array, that is, the not-write pulse width $t_{nwp}$ changes depending upon the period of time from the setting of the address signal to the setting of the write signal, i.e., the setup time $t_{WSA}$ and becomes the minimum under a predetermined setup time t as illustrated by a curve B in FIG. 6. The fact that the not-write pulse width is small as at the setup time t signifies that, in case where a pulse noise exceeding a logic threshold voltage has interfered in the write enabling signal, the resultant signal is regarded as the write enabling signal, so an information is erroneously written into the memory cell.

In accordance with this embodiment, the pulse generator 6 is constructed so as to be started for the first time by a signal of a pulse width exceeding the predetermined time $\tau_1$. Therefore, even when a pulse noise exists in the write enabling signal $\overline{WE}$ to be externally supplied, it is ignored by the pulse generator 6. That is, since the gate circuits $G_1$ and $G_2$ do not respond to external noise, any erroneous writing operation does not take place.

In case where, in contrast to this embodiment, the pulse generator as above described is not disposed, in other words, the write enabling signal $\overline{WE}$ externally supplied is applied to the gate circuits $G_1$ and $G_2$ directly through the buffer circuit $B_3$, the setup time $t_{WSA}$ of the write enabling signal relative to the address signal must be made greater than a predetermined value in order that the not-write pulse width $t_{nwp}$ may have a magnitude greater than a predetermined value.

In accordance with this embodiment, the write enabling signal $\overline{WE}''$ to be internally formed is delayed the delay time $\tau_1$ of the pulse generator 6 with respect to the write enabling signal $\overline{WE}$ to be externally supplied as described before. By making the delay time $\tau_1$ substantially equal to the required setup time, the time difference from the back edge b of the address signal $A_i$ to the front edge a' of the external write enabling signal $\overline{WE}$ can be reduced down to zero. As a result, the timing margin of the external write enabling signal $\overline{WE}$ can be made large.

In this embodiment, the write cycle can be made higher in speed for the reasons described previously and mentioned above.

With the construction as in the embodiment wherein the operation of the output buffer circuit $B_1$ is controlled by the write enabling signal and wherein the operating timing of the output buffer circuit $B_1$ is made different from those of the gate circuits $G_1$ and $G_2$, the following effects can be achieved.

Figure 4:
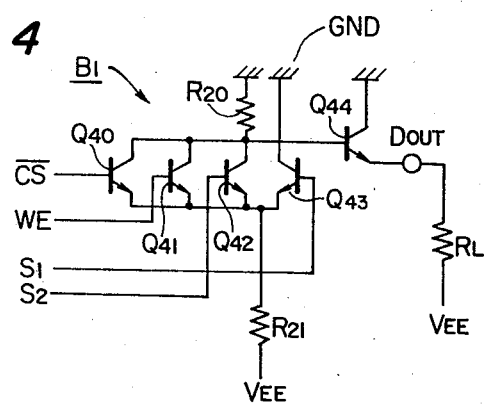
FIG. 4 is a concrete circuit diagram of an output buffer circuit, FIG. 5, including A–I, is an operating waveform diagram of the bipolar memory circuit according to this invention.

For example, in case where a comparatively heavy terminating resistor $R_L$ is connected through the external terminal $D_{out}$ to the output end of the output buffer circuit $B_1$ constructed as shown in FIG. 4, an operating current to flow through the output buffer circuit $B_1$ differs greatly between the high level and low level of the output of the circuit. By way of example, the operating current of the output buffer circuit for producing the output of the high level becomes a large value of about 22 mA, while the operating current for producing the output of the low level becomes a small value of about 6 mA.

According to the construction of FIG. 1, when the memory circuit is not in the writing operation, the output buffer circuit $B_1$ provides a signal which corresponds to the stored information of a memory cell selected by the address signal $A_i$. When the external write enabling signal $\overline{WE}$ is made by the low level, the output of the output buffer circuit $B_1$ is forced into the low level irrespective of the signals supplied to the sense lines $S_1$ and $S_2$.

Accordingly, when the write enabling signal $\overline{WE}$ is made the low level at a time $t_{10}$ as illustrated at D in FIG. 5 by way of example, the output buffer circuit $B_1$ has its output changed from the high level to the low level at substantially the same time $t_{11}$ as the time $t_{10}$. As a result, the operating current of the output buffer circuit $B_1$ changes greatly.

Across the inductance component and resistance component (not shown) of the power supply line, for example, grounded interconnection GND of the memory circuit, a voltage is generated in response to the great change of the operating current. Therefore, the potential of the grounded interconnection GND is changed as shown at I in FIG. 5.

Unless the pulse generator 6 as previously stated is disposed, the potential of the power supply line as above stated is changed by the output buffer circuit $B_1$ at substantially the same times as the front edges of the write pulses $W_0$ and $W_1$. In this case, the changing timings and changing levels of the write pulses $W_0$ and $W_1$ are unfavorably modulated in response to the potential fluctuations of the power supply line on account of the construction of the gate circuits $G_1$ and $G_2$. As the result of the impertinent changing timing and changing level of the write pulse, there arises the fear that an erroneous information will be written into the memory cell. Since, with the embodiment, the writing operation is delayed the delay time $\tau_1$ owing to the delay circuit 7 relative to the external write enabling signal, the fluctuation timing of the power supply line can be brought into disagreement with the front edges of the write pulses $W_0$ and $W_1$ (writing operation-starting timings). It is accordingly possible to perform the writing operation under a stable supply voltage state.

Figure 7:
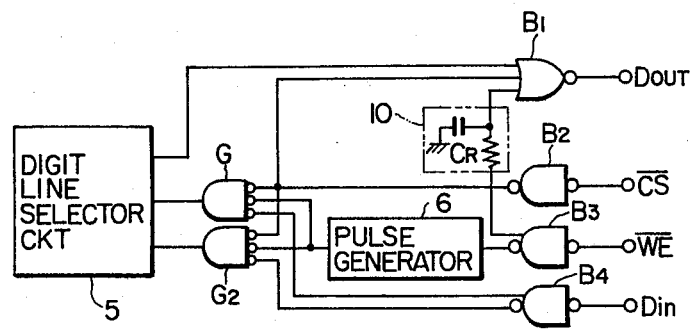
FIG. 7 is a logic circuit diagram of essential portions showing another embodiment of this invention.

To the end of reducing the fluctuations of the potential on the power supply line, an embodiment in FIG. 7 intends to supply the write enabling signal provided from the buffer circuit $B_3$, to the output buffer circuit $B_1$ through an integration circuit 10.

Since the rates of change of the rise and fall of the control signal of the buffer circuit $B_1$ can be made small in this way, the voltage fluctuations of the power supply line GND can be made small. As a result, even in case where the fluctuation timing of the power supply line GND and the rise timing of the writing pulse $W_1$ are synchronous, a stable writing operation is permitted.

The control signal WE of the output buffer circuit $B_1$ may well have the rate of change of its rise or fall reduced by, for example, lowering the output driving capability of the input buffer circuit $B_3$ which forms this signal WE.

This invention is not restricted to the foregoing embodiments, but the pulse generator 6 can be modified variously, and a NAND gate circuit etc. may well be adopted as the gate circuit $G_3$ in some ways of setting logic levels. The flip-flop circuit 9 and the delay circuit 8 may well be replaced with a one-shot multivibrator.

Figure 8:
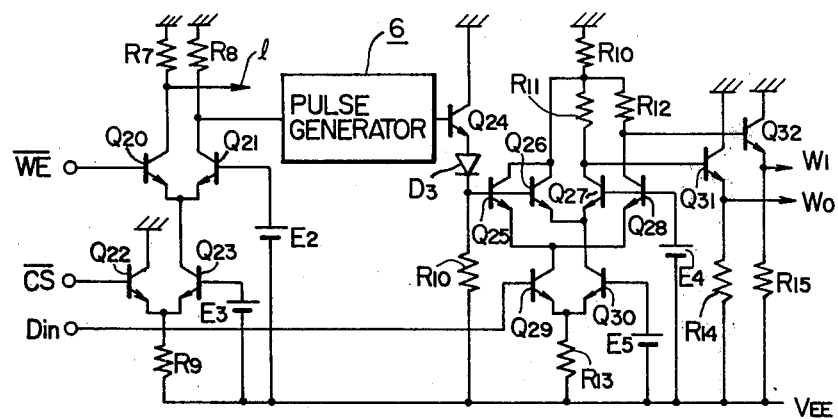
FIG. 8 is a circuit diagram of still another embodiment.

As shown in FIG. 8, the write enabling signal to be supplied to the pulse generator 6 may well be generated from a logic circuit which is constructed of resistors $R_7$ to $R_9$, transistors $Q_{20}$ to $Q_{23}$ and reference voltage sources $E_2$ and $E_3$ and which receives the chip select signal $\overline{CS}$ and the write enabling signal $\overline{WE}$.

In FIG. 8, transistors $Q_{25}$ and $Q_{26}$ have their bases brought into a potential higher than a reference potential $E_4$ and are therefore put into the "on" state at the operation of reading an information. Transistors $Q_{27}$ and $Q_{28}$ are put into the "off" state accordingly. One of transistors $Q_{29}$ and $Q_{30}$ is put into the "on" state by the input data signal $D_{in}$. The current of the transistor $Q_{29}$ or $Q_{30}$ flows to a resistor $R_{10}$ through the transistor $Q_{25}$ or $Q_{26}$. Since the transistors $Q_{27}$ and $Q_{28}$ are held in the "off" state as described above, substantially no voltage drop occurs across resistors $R_{11}$ and $R_{12}$. As a result, the potentials of the write lines $W_1$ and $W_0$ are made the same potential as $V_R$.

At the writing operation, the transistors $Q_{25}$ and $Q_{26}$ are put into the "off" state. At this time, if e.g. the input data signal $D_{in}$ is at the high level, the transistor $Q_{29}$ is in the "on" state and the transistor $Q_{30}$ in the "off" state. Since the current of the transistor $Q_{29}$ flows to the resistors $R_{10}$ and $R_{12}$ through the transistor $Q_{28}$, the write line $W_1$ is made the low potential $V_{WL}$ and the write line $W_0$ is made the intermediate potential $V_R$.

The control signal for the output buffer circuit is provided from a line 1 connected to the resistor $R_7$.

We claim:

1. A bipolar memory circuit comprising:
   a plurality of memory cells,
   an address decoder which receives an address signal and which provides a signal for selecting one of the plurality of memory cells corresponding to the address signal,
   a pulse generator which is started by a write enabling signal and which provides a pulse signal having a fixed pulse duration, and
   a gate circuit which receives an input data signal and the pulse signal and which provides a write pulse signal corresponding to the input data signal to be written into the selected memory cell, for a period determined by said pulse signal.

2. A bipolar memory circuit according to claim 1, wherein said pulse generator is constructed of a first delay circuit which receives said write enabling signal, a gate circuit which receives said write enabling signal and an output signal of said first delay circuit, and a first circuit which is started by an output signal of said gate circuit and which provides said pulse signal having the fixed pulse duration.

3. A bipolar memory circuit according to claim 2, wherein said first circuit is constructed of a second delay circuit which receives said output signal of said gate circuit, and a flip-flop circuit which has first and second stable statuses, which is brought into the first stable status by said output signal of said gate circuit and which is brought into the second stable status by an output signal of said second delay circuit.

4. A bipolar memory circuit according to claim 1, further comprising a logic circuit which receives said write enabling signal and a chip enabling signal, said pulse generator being started by an output signal of said logic circuit.

5. A bipolar memory circuit according to claim 2, further comprising an output buffer circuit which receives a signal provided from the selected memory cell, said output buffer circuit having its operation controlled by said write enabling signal.

6. A bipolar memory circuit comprising:
   a plurality of memory cells,
   an address decoder which receives an address signal and which provides a signal for selecting one of the plurality of memory cells corresponding to the address signal,
   a pulse generator which receives a write enabling signal and which provides a pulse signal corresponding to the write enabling signal,
   a gate circuit which receives an input data signal and the pulse signal and which provides a write pulse signal corresponding to the input data signal to be written into the selected memory cell, for a period determined by said pulse signal,
   an output buffer circuit which receives a signal provided from the selected memory cell and a control signal which provides a signal corresponding to the signal provided from the memory cell, for a period determined by the control signal, and
   a delay circuit which forms an output signal delayed with respect to an input signal thereof,
   an operating timing of said pulse generator and that of said output buffer circuit being made different from each other by said delay circuit.

7. A bipolar memory circuit according to claim 6, wherein the control signal to be supplied to said output buffer circuit has its changing rate limited by an integration circuit.

8. A bipolar memory circuit according to claim 6, said bipolar memory circuit being operated by a single power supply.

* * * * *